United States Patent [19]
Kakinuma et al.

[11] Patent Number: 4,887,166
[45] Date of Patent: Dec. 12, 1989

[54] DIRECT-CONTACT-TYPE IMAGE SENSOR

[75] Inventors: Hiroaki Kakinuma; Yukio Kasuya; Masaaki Sakamoto; Tsukasa Watanabe; Mikio Mouri, all of Tokyo, Japan

[73] Assignee: Oki Electric Industry Co., Ltd., Tokyo, Japan

[21] Appl. No.: 197,449

[22] Filed: May 20, 1988

[30] Foreign Application Priority Data

| May 22, 1987 | [JP] | Japan | 62-123691 |
| Jul. 22, 1987 | [JP] | Japan | 62-112386[U] |
| Nov. 6, 1987 | [JP] | Japan | 62-279287 |
| Nov. 27, 1987 | [JP] | Japan | 62-297488 |

[51] Int. Cl.$^4$ .................. H04N 3/14; H04N 1/024
[52] U.S. Cl. .................. 358/471; 358/213.11; 250/578; 250/211 R; 250/211 J
[58] Field of Search ........... 358/294, 295, 213.11; 250/578, 211 R, 211 J

[56] References Cited

U.S. PATENT DOCUMENTS

| 3,603,730 | 9/1971 | Weigl | 358/294 |
| 4,365,274 | 12/1982 | Takenouchi | 348/294 |
| 4,408,230 | 10/1983 | Tamura | 358/294 |
| 4,419,696 | 12/1983 | Hamano | 358/294 |
| 4,567,374 | 1/1986 | Takenouchi | 358/294 |
| 4,660,095 | 4/1987 | Cannella | 358/294 |
| 4,691,243 | 9/1987 | Cannella | 358/294 |
| 4,698,494 | 10/1987 | Kato et al. | 250/578 |
| 4,724,490 | 2/1988 | Tanioka | 358/294 |
| 4,737,833 | 4/1988 | Tabei | 358/213.11 |
| 4,746,989 | 5/1988 | Cannello | 358/294 |
| 4,755,859 | 7/1988 | Suda | 357/15 |
| 4,758,734 | 7/1988 | Uchida | 358/213.11 |
| 4,763,189 | 8/1988 | Kamatsu | 358/294 |
| 4,768,096 | 8/1988 | Cannella | 358/294 |
| 4,777,534 | 10/1988 | Yaniv | 358/294 |
| 4,803,375 | 2/1989 | Saito et al. | 250/578 |
| 4,827,117 | 5/1989 | Uchida et al. | 250/211 R |

FOREIGN PATENT DOCUMENTS 0152180 8/1985 Japan .............. 358/213.11

Primary Examiner—Edward L. Coles, Sr.
Assistant Examiner—Jerome Grant
Attorney, Agent, or Firm—Wenderoth, Lind & Ponack

[57] ABSTRACT

In a contact-type image sensor comprising an array of photosensor elements for receiving light reflected from a document, and a protective layer disposed above the array of photosensor elements for protecting the array of photosensor elements when contact is made with the document, means are provided for discharging electric charges accumulated on the protective layer. This may comprise the protective layer with a relatively low resistivity or a separate conductive layer above or within the protective layer.

11 Claims, 10 Drawing Sheets

DIRECT-CONTACT-TYPE IMAGE SENSOR

BACKGROUND OF THE INVENTION

This invention relates to an image sensor, more particularly to a contact-type image sensor for actual size reading, i.e., one-to-one scanning of an information medium such as a document.

A contact-type image sensor providing actual size reading of subject copy has the advantage of permitting an image scanning apparatus such as a facsimile apparatus to be made smaller, because no reducing optical system is needed.

An example of the prior art in this field is given in the article "Koro ga mijikai mitchakugata imeji sensa OA kiki kogataka no kirifuda ni" (Contact-type image sensors with short light paths—the key to smaller OA equipment) in Nikkei Mechanical, Dec. 1, 1986, pp. 71–78.

The prior art configuration will be described with reference to the drawings.

FIG. 1 is a cross-sectional view of a prior art contact-type image sensor. As shown in this drawing, light from an LED array 1 illuminates a document 2, and the reflected light passes through a rod lens array 3, forming an image on the photosensor area of a contact-type image sensor 4.

A contrasting device is the direct-contact-type image sensor in FIG. 2, in which light from an LED array 6 acting as a light source passes through a glass substrate 9, illumination windows 10, and a transparent dielectric protective film 7 several microns in thickness, illuminates a document 5, then is reflected back through the transparent dielectric protective film 7 and sensed by a photoelectric transducer made of amorphous silicon 8. The numeral 11 is a metal film acting as an electrode, 12 is a transparent electrode, 13 is a common electrode, and 14 is a roller.

Another example of publication showing similar contact-type image sensors is the paper "Kanzen mitchakugata amorufasu shirikon imeji sensa" (A direct-contact-type amorphous silicon image sensor) in the proceedings of a symposium on advances in amorphous silicon devices held by The Society of Electrophotography of Japan, (May 24, 1985, pp. 53–56).

Since the contact-type image sensor illustrated in FIG. 1 has a rod lens array 3, it is about 20 mm in height as shown in FIG. 1, cannot be reduced in size, and requires an assembly manufacturing process.

In the direct-contact-type image sensor shown in FIG. 2, to improve the resolution the roller 14 must feed the document 5 in pressure contact with the transparent dielectric protective film 7. A resulting problem is that friction arises between the paper document 5 and the transparent dielectric protective film 7, the transparent dielectric protective film 7 becomes charged, and its electric field causes malfunction of the photosensor elements. The cause of the charge induced by friction between the transparent dielectric protective film 7 and the paper is the high resistivity ($>10^{15}$ ohm·cm) of the film of, for example, $SiN_x$ used as the transparent dielectric protective film.

SUMMARY OF THE INVENTION

An object of this invention is to eliminate these problems, prevent malfunction of the photosensor elements, and provide a highly reliable direct-contact-type image sensor.

Another object of this invention is to provide a contact-type image sensor with good contrast and other characteristics.

Another object of this invention is to provide a contact-type image sensor with a good S/N ratio and high reliability.

A contact-type image sensor according to this invention comprises an array of photosensor elements for receiving light reflected from a document and a protective layer disposed above the photosensor array for protecting the photosensor array when contact is made with the document. The characteristic features of the invention reside in the means of discharging the electric charges generated by friction of the protective layer.

Figure 1:
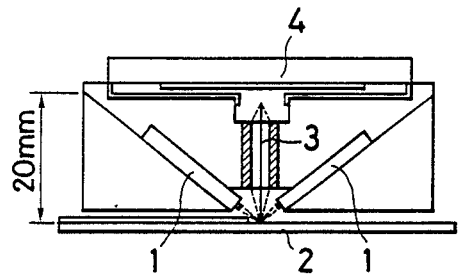
FIG. 1 is a cross-sectional view of a prior art contact-type image sensor.
Figure 2:
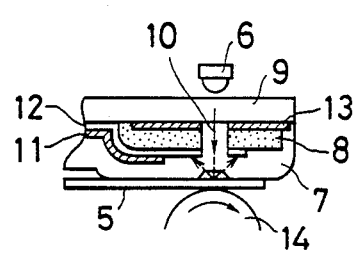
FIG. 2 is a cross-sectional view of a prior art direct-contact-type image sensor.

To simplify the drawing, cross-hatching to indicate the cross-section is omitted in some parts.

DETAILED DESCRIPTION OF THE EMBODIMENTS

Embodiments of this invention will be explained in detail below with reference to the drawings.

Figure 3A:
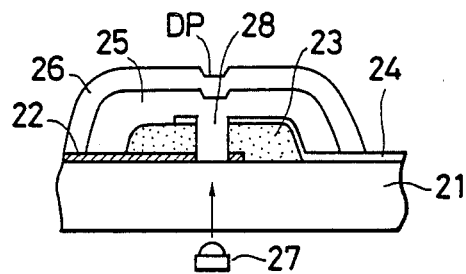
FIG. 3A is a cross-sectional view of a direct-contact-type image sensor illustrating an embodiment of this invention.

FIG. 3A is a cross-sectional view of a direct-contact-type image sensor illustrating an embodiment of this invention.

In this drawing the numeral 21 denotes a transparent dielectric substrate such as glass, 22 is a common electrode made of an opaque metal which also acts as a light shield. The common electrode 22 may be formed by evaporation or sputtering, followed by photolithography and etching for patterning. 23 is a layer of photoelectric-converting semiconductor such as amorphous silicon. The amorphous silicon layer 23 can be formed by a method such as P-CVD (plasma-assisted chemical vapor deposition), photo-CVD, ECR-CVD (electron cyclotron resonance-CVD), or reative sputtering through a mask.

24 denotes individual electrodes made of a transparent conductive film such as an indium-tin oxide (ITO) film. The individual electrodes 24 are preferrably made of a transparent conductive film such as an indium-tin oxide (ITO) film. The intersecting portions of these common (lower) and individual (upper) electrodes 22 and 24 function as photosensor elements. The individual electrodes may be formed by evaporation or sputtering, followed by photolithography and etching.

Light-admitting windows 28 are opened through the common electrode 22, the photoelectric-converting semiconductor layer 23, and the individual electrodes 24. The light-admitting windows 28 can be formed by removal of the common electrode 22, the photosensitive layer 23, and the individual electrodes 24 from designated regions. This may be implemented by photolithography and etching.

The numeral 25 denotes a high-resistivity dielectric film such as a $SiN_x$ (nitride) film, and 26 denotes a transparent protective film with a relatively low resistivity $\rho \leq 10^{14}$ ohm·cm. The high-resistivity dielectric film 25 may be formed by evaporation or sputtering through a mask. The low-resistivity dielectric film 26 may also be formed by evaporation or sputtering through another mask having openings a little larger than the mask used for the formation of the film 25.

Figure 3B:
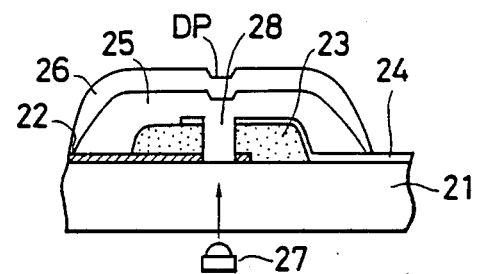
FIG. 3B is a cross-sectional view of a modification of the direct-contact type image sensor of FIG. 3A.

In a modification, the same mask may be used for the formation of the films 25 and 26. In this case, the resulting film 26 has a thickness reduced toward its edges, as shown in FIG. 3B. But such a film 26 has been found to provide satisfactory electrical connection with the common electrode 22. This method of using the same mask for the two films 25 and 26 is advantageous in that the cost of the production is reduced.

If a material with such a relatively low resistivity of $10^{14}$ ohm·cm or less is used, even if the surface of the transparent protective film becomes charged due to friction with a sliding document the surface charge is discharged into the interior of the film. With a certain time constant $\tau$. This $\tau$ can be expressed in terms of the dielectric constant $\epsilon$ and the resistivity $\rho$ of the film as follows:

$$\tau = \epsilon_0 \cdot \epsilon \cdot \rho \quad (1)$$

($\epsilon_0$: dielectric constant of the vacuum)

The constants $\epsilon$ and $\rho$ are properties of the film that are unrelated to its thickness or leakage path. If, for example, the classic values for $SiN_x$ of $\epsilon = 4$, $\rho = 1 \times 10^{15}$ ohm·cm are substituted into equation (1) above, then $\tau = 623$ seconds, so even if a single document page causes only a minute charge, $\tau$ is so long that as document pages are repeatedly scanned the charge will accumulate. This can be prevented by reducing $\tau$ to the time (on the order of one second) between documents; then the charge will not accumulate.

Setting $\tau = 5$ seconds and $\epsilon = 4$, for example, and solving for $\rho$ yields $\rho = 1.4 \times 10^{13}$ ohm·cm.

It follows that, in this case, charge will not accumulate if a material used is with a $\rho$ or smaller than this value.

It has been confirmed through experiments that, for rapid discharge, the value of $\rho$ should not exceed $3 \times 10^{13}$ ohm·cm.

As the material of this transparent protective film it is possible to use amorphous silicon carbide (a-SiC) produced by plasma-assisted CVD or sputtering, amorphous carbon (a-C), a $Ta_2O_5$ or Si-rich amorphous silicon nitride (a-$SiN_x$), amorphous silicon oxide (a-$SiO_x$), or AlSiN, AlSiON, SiON, $Al_2O_3$, $TiO_2$, $ZrO_2$, BN, AlNMgO, or a material such as a-$SiN_x$ or a-$SiO_x$ doped with phosphorous (P) or boron (B) to reduce the value of $\rho$. To allow charge to escape, this transparent protective film 26 is coupled to the common electrode 22, which is grounded. The numeral 27 denotes a LED array.

Figure 4:
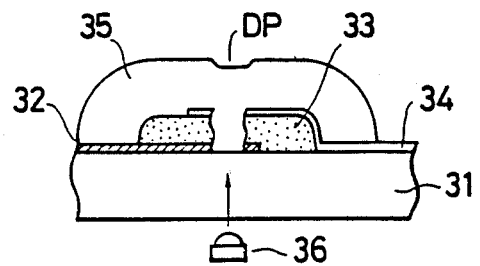
FIG. 4 is a cross-sectional view of a direct-contact-type image sensor illustrating another embodiment of this invention.

FIG. 4 is a cross-sectional view of a direct-contact-type image sensor illustrating another embodiment of this invention, in which the transparent protective film 35 is made solely of a material with a $\rho$ value of $10^{14}$ ohm·cm. In this case, the value of $\rho$ of the transparent protective film 35 must be greater than the value of $\rho$ of the photoelectric-converting semiconductor 33, in order to prevent leakage of charge into the photoelectic-converting semiconductor 33. If the photoelectric-converting semiconductor 33 is made of hydrogenated amorphous silicon (a-Si:H), for example, it is necessary for the value of $\rho$ to be at least $10^{11}$ ohm·cm. The numeral 31 denotes a transparent dielectric substrate such as glass, 32 is an opaque common electrode, 34 denotes individual electrodes made of a transparent conductive film, and 36 is an LED array.

As described in detail above, the above embodiment uses a material with a comparatively small resistivity for the transparent protective film and couples this film to the common electrode, so charge generated by friction between the transparent protective film and the document paper does not accumulate on the surface of the transparent protective film. Malfunctioning of the photosensor elemets is thereby prevented, making it possible to obtain a direct-contact-type image sensor possessing high stability and durability.

Figure 5:
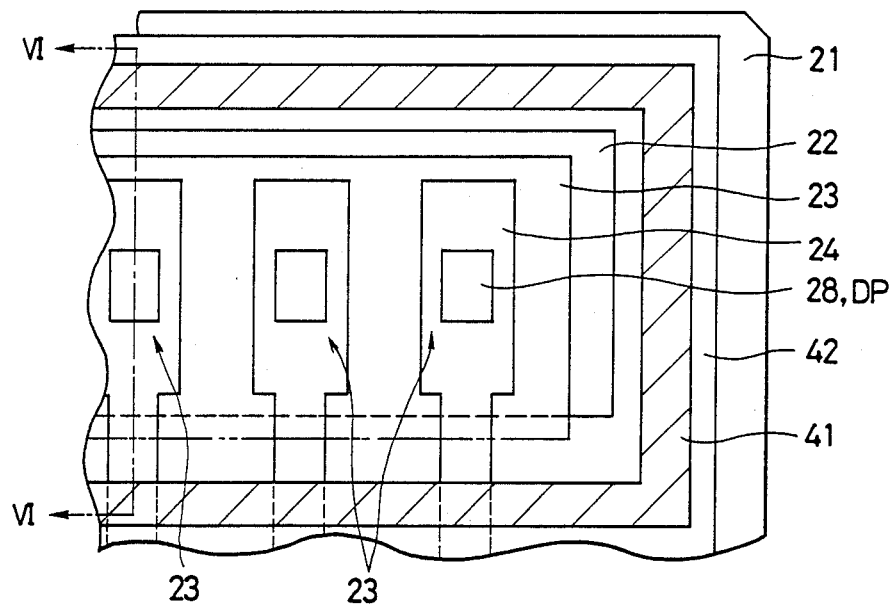
FIG. 5 is a plan view showing the schematic structure of another embodiment of the invention.
Figure 6:
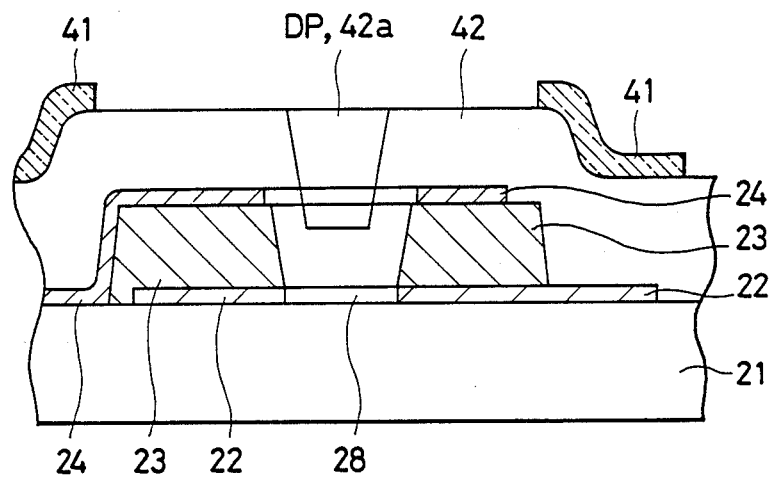
FIG. 6 is a schematic cross-sectional view of the contact-type image sensor shown in FIG. 5 along the line VI—VI shown in FIG. 5.

FIG. 5 is a plan view showing the schematic structure of a contact-type image sensor according to another embodiment of this invention. Only part of the contact-type image sensor is shown in this plan view. FIG. 6 is a cross-sectional view showing a schematic cross section of the contact-type image sensor in FIG. 5 along the line VI—VI in FIG. 5.

The numerals identical to those in FIG. 3A indicate similar components or parts. The substrate 21 is provided with a transparent protective layer 42, which can be a film of a high-resistivity dielectric substance such as $SiN_x$ formed by a suitable method such as sputtering. The resistivity of the layer 42 may be $10^{15}$ ohm·cm or higher. Thus, the protective layer 42 itself is not with the resistivity of $10^{14}$ ohm·cM or less. But, according to this embodiment, a conductive layer 41 is provided on the protective layer 42. The purpose of this conductive layer 41 is to allow electrical charge that accumulates on the protective layer 42 to escape from the protective layer 42 to the outside. In this embodiment, the conductive layer 41 has the form of a window frame located on the protective layer 42 outside the region corresponding to the region in which the photosensor elements are formed (see FIG. 5). Since the purpose of the conductive layer 41 is to allow the escape of electrical charge that accumulates in the protective layer 42 it is necessary for the conductive layer to be grounded in some way. Various methods of grounding can be considered; in this embodiment the conductive layer 41 is grounded by connecting it to the common electrode 22 of the photosensor elements. This permits an effective grounding without changing the fabrication process of the contact image sensor, and is preferable in that it can prevent a variety of undesired effects resulting from the accumulation of electrical charge.

The material of the conductive layer 41 must satisfy the requirement of possessing electrical conductivity, and when the conductive layer is located so that it makes direct contact with the document, as in this embodiment, the conductive layer should preferably possess a flat surface and excellent resistance to wear. Thin films of, for example, Cr (chrome) and Ta (tantalum) are among the materials having these properties. A conductive layer comprising this type of thin metal film can be created by well-known, established techniques of film deposition and photoetching.

Various modifications as described next can be made. For example, the conductive layer 41 can be disposed in the interior of the protective layer 42. Specifically, the first part of the protective layer 42 can be formed, then the conductive layer, then a protective layer can be formed again overlying the conductive layer. In this case, since the conductive layer does not make direct contact with the document, it does not need to be made of a wear-resistant material. In this case too, the conductive layer should preferably be grounded by connection to the common electrode of the photosensor elements.

In the embodiment described herein, the conductive layer had the plane configuration of a window frame, but this shape can be altered to any other shape that efficiently removes electrical charge, as required by design considerations. It is of course also possible for the conductive layer to be a transparent electrode covering the photosensor area.

Because a contact-type image sensor according to the above embodiment has a conductive layer disposed on the surface or in the interior of the dielectric protective layer which tends to accumulate static charge, as described above, if the conductive layer is suitably grounded, electrical charge generated by friction arising from contact between the document and the protective layer will not accumulate in the protective layer.

Figure 7:
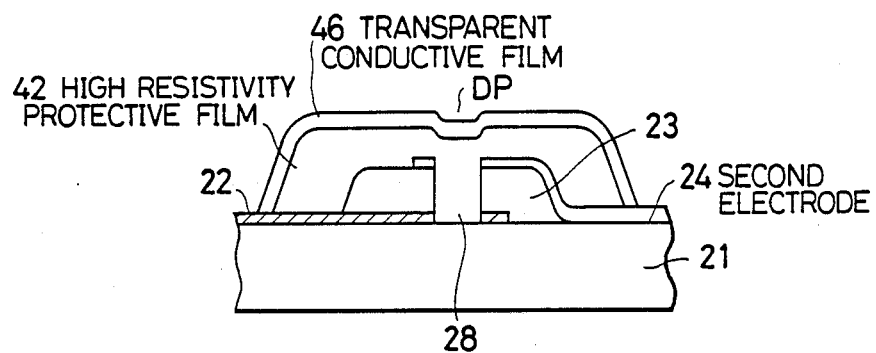
FIG. 7 is a cross-sectional view of another embodiment of the present invention.

FIG. 7 is a cross-sectional view of another embodiment of this invention. The numerals identical to those in FIG. 3 denote similar components or parts. According to this embodiment, a transparent conductive film 46 of, for example, indium-tin oxide (ITO) is formed on the high-resistivity protective film 42 by a method such as sputtering and connected to the common electrode 22.

The individual electrode layer 24 and the high-resistivity protective film 42 are formed on the photosensor layer 23, and the transparent conductive film 46 is formed by a method such as sputtering.

The document is pressed in contact with the transparent conductive film 46, so friction between the document and this transparent conductive film 46 generates carriers. The carriers generated in this way are conducted through the transparent conductive film 46 to the first electrode layer 22, and are thus removed from the contact image sensor.

Figure 8:
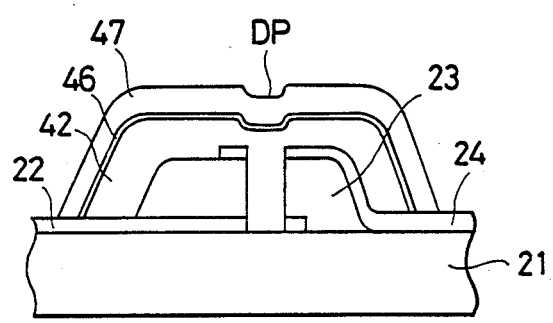
FIG. 8 is a cross-sectional view of another embodiment of the invention.

FIG. 8 is a cross-sectional view of a further embodiment of this invention. The contact-type image sensor shown in FIG. 8 has an additional protective film 47 formed on the transparent conductive film 46. The purposes of this conductive film 47 ar to protect the transparent protective film 46, and to facilitate the escape of carriers generated by friction with the document to the transparent protective film 42. This is achieved by use of the protective film 47 having a lower resistivity than the high-resistivity protective film 42.

In the contact-type image sensor shown in FIG. 8, although the transparent conductive film 46 is formed between the high-resistivity protective film 42 and the protective film 47, carriers generated in the protective film 47 by friction with the document can still be removed through the transparent conductive layer 46 as in the contact-type images sensor shown in FIG. 7.

In the embodiments of FIG. 7 and FIG. 8, a transparent conductive film is formed on the surface or in the interior of a high-resistivity protective film, and this transparent conductive film is connected to the electrode of the photosensor layer, so carriers generated in the contact-type image sensor by friction with the document are conducted through the transparent conductive film to the photosensor electrode and thus removed.

In the various embodiments described, depressions DP are present on the surface of the protective layer 26, 35, 42, or 47, or of the conductive film 46 covering the protective film 42. The depressions are formed due to formation of the light-admitting windows, i.e., local removal of the common electrode 22, the photoreceptor layer 23, and the individual electrode layer 24. The shape of the depressions DP conform to the shape of the cross section of the light-admitting windows 28, as is best seen from the combination of FIG. 5 and FIG. 6.

With the above depressions DP, dust and ink are easy to be accumulated, reducing transmission of light. To obviate this problem, the improvements as proposed in Japanese Utility Model Applications No. 94679/1986, No. 94680/1986 and No. 94681/1986 can be applied to the image sensors of the above embodiments. The coinventors of the inventions disclosed in these applications are partially in common with the coinventors of the subject application. Moreover, these U.M. applications have been assigned to the same assignee as the subject application.

Figure 9:
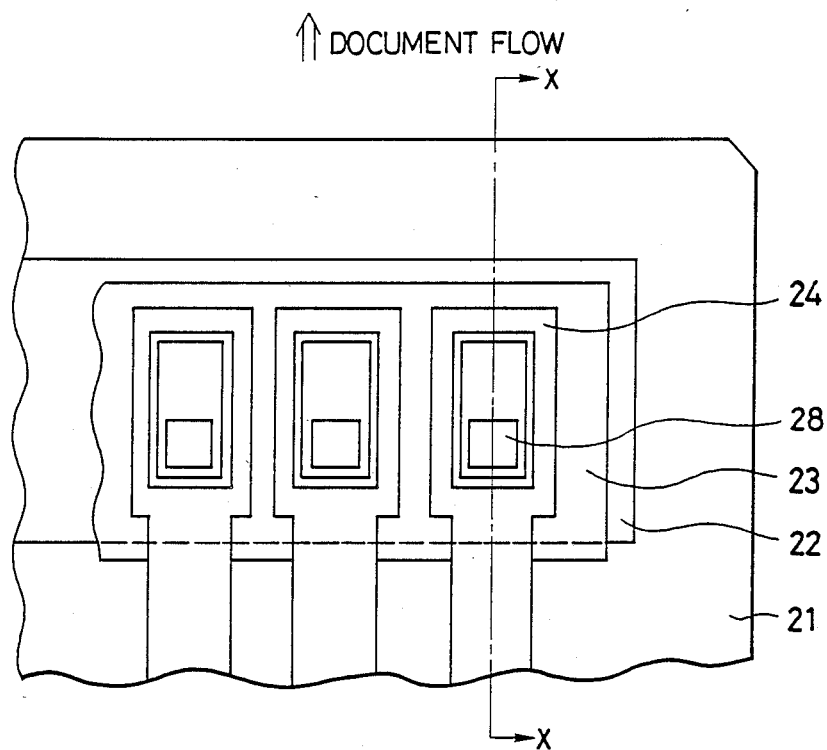
FIG. 9 is a plan view showing a modification of the depressions DP.
Figure 10:
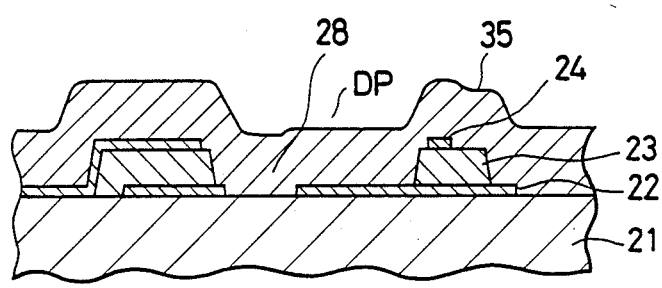
FIG. 10 is a cross sectional view taken along line X—X in FIG. 9.

According to the Utility Model Application No. 94680/86, those parts of the photoreceptor layer 23 situated downstream (with respect to the flow of the document) of the light-admitting windows 28 have been removed as shown in FIG. 9 and FIG. 10. Accordingly, the depressions DP are elongated toward the downstream.

Figure 11:
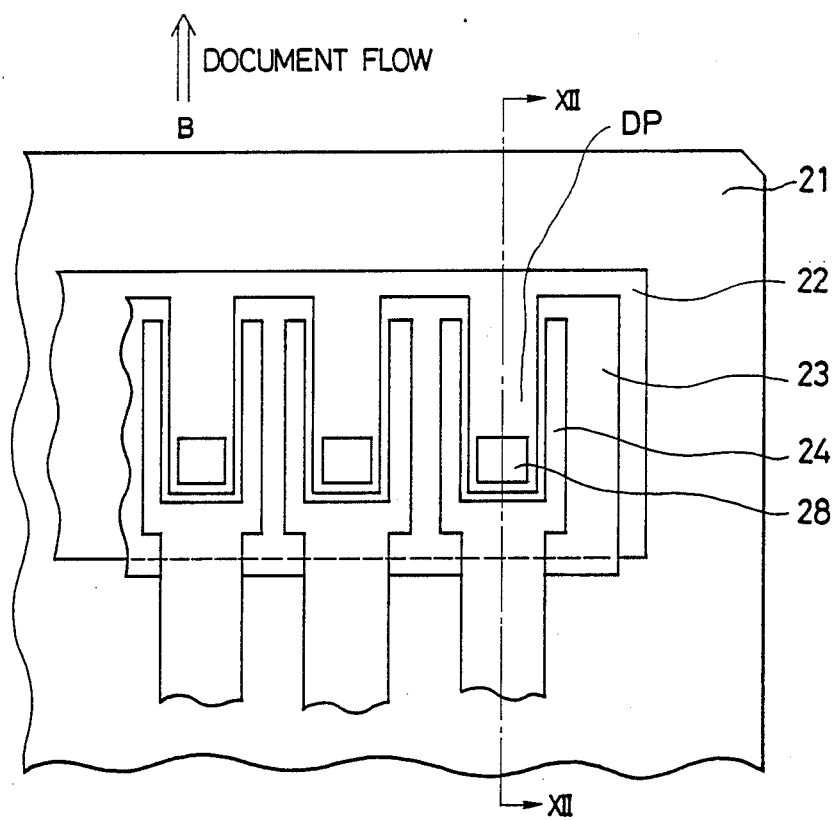
FIG. 11 is a plan view showing another modification of the depressions DP.
Figure 12:
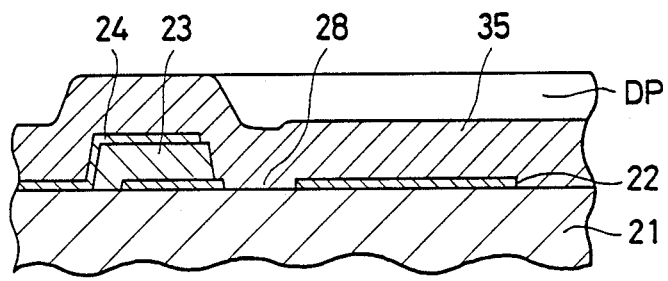
FIG. 12 is a cross sectional view taken along line XII—XII in FIG. 11.

According to the Utility Model Application No. 94679/86, the depressions DP extend toward the down stream up to the edge of the photoreceptor layer 23, as shown in FIG. 11 and FIG. 12.

Figure 13:
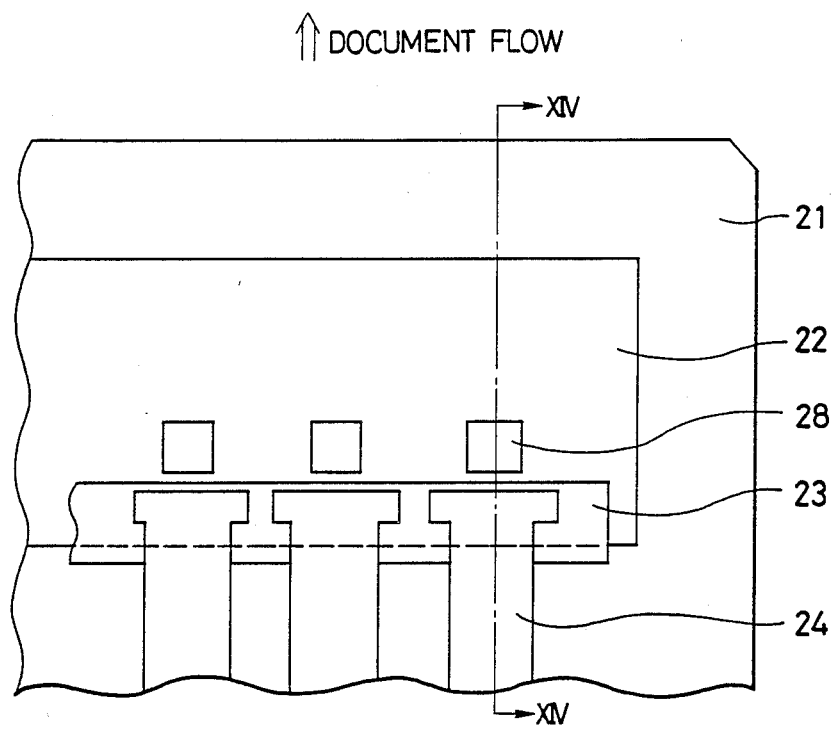
FIG. 13 is a plan view showing another modification of the depressions DP.
Figure 14:
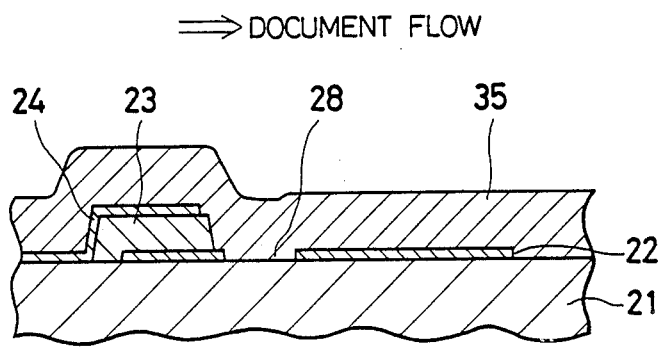
FIG. 14 is a cross sectional view taken along line XIV—XIV in FIG. 13.

In the Utility Model Application No. 94681/86, the photoreceptor layer is formed only in the side upstream of the light-admitting windows as shown in FIG. 13 and FIG. 14. Accordingly, the "depressions" adjacent each other are continuous. The surface of the protective film has a high part on the upstream side and a low part on the downstream side.

This invention is not limited to the embodiments described herein, but admits of many variations based on the innovative concept, which are not excluded from the scope of the invention.

What is claimed is:

1. A contact-type image sensor comprising an array of photosensor elements for receiving light reflected from a document,
   a protective layer disposed over said array of photosensor elements for protecting said array of photosensor elements when contact is made with said document, and
   means for discharging electric charges accumulated on said protective layer whereby electric charges generated by friction between said protection layer and said document is discharged by said discharging means,
   wherein at least that portion of said protective layer that makes contact with said document is made of a material with a resistivity of $10^{14}$ ohm·cm or less, and is connected to a common electrode of said photosensor array to act also as said discharging means.

2. An image sensor according to claim 1, wherein the resistivity of said material is $10^{13}$ ohm·cm or less.

3. An image sensor according to claim 1, wherein said photosensor array is formed of a photoelectric converting semiconductor and that part of the protective layer which is in contact with the photoelectric converting semiconductor is made of a material with a resistivity in the range of $10^{11}$ to $10^{14}$ ohm·cm.

4. An image sensor according to claim 1, wherein said protective layer is formed of amorphous silicon carbide (a-SiC), amorphous carbon (a-C), Si-rich amorphous silicon nitride (a-$SiN_x$), amorphous silicon oxide (a-$SiO_x$), or Al SiN, AlSiON, SiON, $Al_2O_3$, $Ta_2O_5$, $TiO_2$, $ZrO_2$, BN, AlN, or MgO.

5. An image sensor according to claim 1, wherein said discharging means comprises a conductive layer provided within said protective layer.

6. An image sensor according to claim 5, wherein said conductive layer is connected to a common electrode of said photosensor array.

7. An image sensor according to claim 1, further comprising a transparent conductive layer formed in the interior of said protective layer and connected to said first electrode.

8. An image sensor according to claim 1, further comprising
   a substrate; and
   a first electrode layer formed as a common electrode on said substrate;
   wherein said photosensor element array is formed in a photoelectric-converting semiconductive layer that is formed on said first electrode layer.

9. An image sensor according to claim 8, wherein an array of light-admitting windows are provided through the photosensor layer.

10. An image sensor according to claim 1, wherein said protective layer is transparent.

11. An image sensor according to claim 1, wherein said common electrode is formed on a substrate, said photo-sensor elements are formed in a photoelectric converting layer which is formed on said common electrode, said image sensor further comprises a plurality of individual electrodes formed on said photoelectric converting layer, and said protective layer is formed to cover said photo-electric converting layer and said individual electrodes.

* * * * *